United States Patent
Kao

(10) Patent No.: US 8,334,189 B2
(45) Date of Patent: Dec. 18, 2012

(54) METHOD FOR FORMING TRENCHES AND TRENCH ISOLATION ON A SUBSTRATE

(75) Inventor: Ching-Hung Kao, Hsin-Chu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/011,936

(22) Filed: Jan. 24, 2011

(65) Prior Publication Data

US 2012/0190168 A1 Jul. 26, 2012

(51) Int. Cl.
*H01L 21/76* (2006.01)

(52) U.S. Cl. .................. 438/424; 257/E21.546

(58) Field of Classification Search .............. 438/424; 257/E21.546

See application file for complete search history.

(56) References Cited

U.S. PATENT DOCUMENTS

| 6,624,022 | B1 * | 9/2003 | Hurley et al. ............... 438/256 |
| 6,864,152 | B1 * | 3/2005 | Mirbedini et al. ............ 438/427 |
| 6,949,801 | B2 * | 9/2005 | Parat et al. .................. 257/374 |
| 7,193,262 | B2 | 3/2007 | Ho |
| 2004/0092115 | A1 * | 5/2004 | Hsieh et al. ................. 438/694 |
| 2005/0074938 | A1 * | 4/2005 | Han ............................ 438/258 |
| 2006/0180885 | A1 | 8/2006 | Rhodes |
| 2006/0258042 | A1 | 11/2006 | Roy |
| 2007/0187734 | A1 | 8/2007 | Adkisson |
| 2007/0264792 | A1 | 11/2007 | Dietz |
| 2008/0135931 | A1 | 6/2008 | Challa |
| 2010/0032773 | A1 * | 2/2010 | Shrivastava et al. ......... 257/408 |
| 2011/0089526 | A1 * | 4/2011 | Lee et al. .................... 257/510 |

* cited by examiner

*Primary Examiner* — Alexander Ghyka
*Assistant Examiner* — Stanetta Isaac
(74) *Attorney, Agent, or Firm* — Winston Hsu; Scott Margo

(57) ABSTRACT

A method for forming trench isolation on a substrate includes providing a substrate having thereon a pad layer and a hard mask; forming a first shallow trench in a first area and a second trench in a second area on the substrate; forming a resist layer covering the first area while exposing the second area; etching the second shallow trench to form a deep trench; forming oxide liner within the first shallow trench and the deep trench; and filling the shallow trench and the deep trench with an oxide layer.

14 Claims, 9 Drawing Sheets

METHOD FOR FORMING TRENCHES AND TRENCH ISOLATION ON A SUBSTRATE

BACKGROUND OF THE INVENTION

1. Field of the Invention

The present invention relates generally to the field of semiconductor manufacture. More particularly, the present invention relates to a method for forming trenches and trench isolation on a semiconductor substrate.

2. Description of the Prior Art

As known in the art, shallow trench isolation (STI) structures are usually used in combination with deep trench isolation (DTI) structures in the manufacture of semiconductor devices in order to electrically isolate adjacent devices from each other, for example, for the isolation between adjacent image sensor pixels.

FIGS. 1-9 illustrate a conventional method for forming trenches and trench isolation on a substrate. In FIG. 1, a pad oxide layer 22 and a pad nitride layer 24 are formed on the substrate 12. Using lithographic and etching processes, shallow trenches 26 are formed in the pad nitride layer 24, the pad oxide layer 22 and the substrate 12 within the first area 101, for example, the logic circuit area of an image sensor device. An oxide liner 26a is then formed on the surface of each of the shallow trenches 26. In FIG. 2, an oxide layer 30 is deposited to fill the shallow trenches 26 and is then densified. In FIG. 3, a reverse mask is typically used for removing a portion of the oxide layer 30 within the second area 102, for example, a pixel array area of an image sensor device. In FIG. 4, a chemical mechanical polishing (CMP) is carried out to remove the oxide layer 30 outside the shallow trenches 26 to thereby forming the shallow trench isolation (STI) structures 28. In FIG. 5, a hard mask 40 is deposited to cover the pad nitride layer 24 and the STI structures 28. In FIG. 6, using lithographic and etching processes, openings 40a are formed in the hard mask 40, the pad nitride layer 24 and the pad oxide layer 22 within the second area 102. In FIG. 7, through the openings 40a, the substrate 12 is etched to form deep trenches 46. In FIG. 8, an oxide liner 46a is formed on the surface of each of the deep trenches 46. An oxide layer 50 is deposited to fill the deep trenches 46, and is then densified. In FIG. 9, a CMP process is carried out to remove the oxide layer 50 and the hard mask 40 outside the deep trenches 46, thereby forming deep trench isolation (DTI) structures 48.

The above-described conventional method for forming trenches and trench isolation has several drawbacks. First, the conventional method is complicated and time-consuming because the shallow trenches 26 and the deep trenches 46 are formed separately in different stages. Two etching steps and two liner oxidation steps are required to complete the shallow trenches 26 and the deep trenches 46. In addition, it requires two gap-filling steps and two densification steps to complete the STI structures and the DTI structures. Second, a reverse mask is required to reveal the oxide layer 30 within the second area 102 and a subsequent dry etching process is needed to etch away a portion of the exposed oxide layer 30 from the second area 102 in order to avoid loading effect during CMP process or the risk of incomplete removal of the oxide layer 30 on the pad nitride layer 24. The reverse mask adds to the cost of the semiconductor manufacture.

SUMMARY OF THE INVENTION

It is therefore one objective of this invention to provide an improved method for forming trenches and trench isolation on a semiconductor substrate, in order to solve the above-described prior art problems and shortcomings.

According to one aspect of the invention, a method for forming a trench includes providing a substrate having thereon a first area and a second area, wherein a pad layer and a hard mask are provided on the substrate; forming a first patterned photoresist layer on the hard mask, the first patterned photoresist layer having a first opening in the first area and a second opening in the second area; etching the hard mask, the pad layer and the substrate through the first opening and the second opening, thereby forming a first shallow trench and a second shallow trench; stripping the first patterned photoresist layer; forming a second patterned photoresist layer on the hard mask, the second patterned photoresist layer masking the first area while exposing the second area; and using the second patterned photoresist layer and the hard mask together as an etching mask, etching a bottom of the second shallow trench to thereby form a deep trench.

According to another aspect of the invention, a method for forming a trench isolation includes providing a substrate having thereon a first area and a second area, wherein a pad layer and a hard mask are provided on the substrate; etching the hard mask, the pad layer and the substrate to thereby form a first shallow trench and a second shallow trench within the first area and the second area respectively; forming a patterned photoresist layer on the hard mask, the patterned photoresist layer masking the first area while exposing the second area; using the patterned photoresist layer and the hard mask together as an etching mask, etching a bottom of the second shallow trench to thereby form a deep trench; forming a first oxide liner and a second oxide liner on a surface of the first shallow trench and a surface of the deep trench; and depositing an oxide layer to fill the first shallow trench and the deep trench.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to an integrated method for forming shallow and deep trenches as well as shallow trench isolation (STI) structures and deep trench isolation (DTI) structures on a semiconductor substrate. Although not specifically indicated, the claimed invention may be applied in various technical fields, for example, electrical isolation between image sensor pixels, electrical isolation for power management devices or high-voltage MOS devices.

Figure 1:
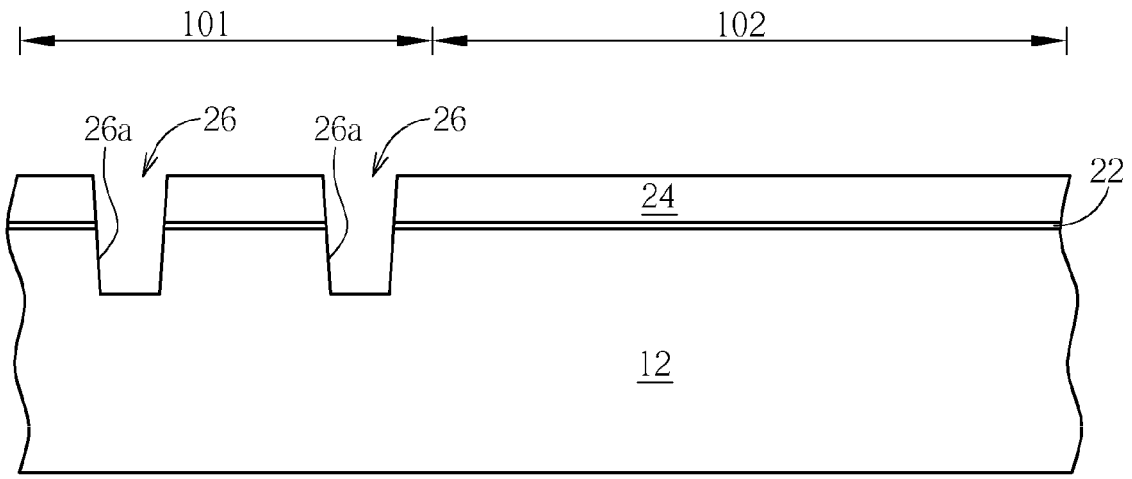
FIGS. 1-9 illustrate a conventional method for forming trenches and trench isolation on a substrate.
Figure 2:
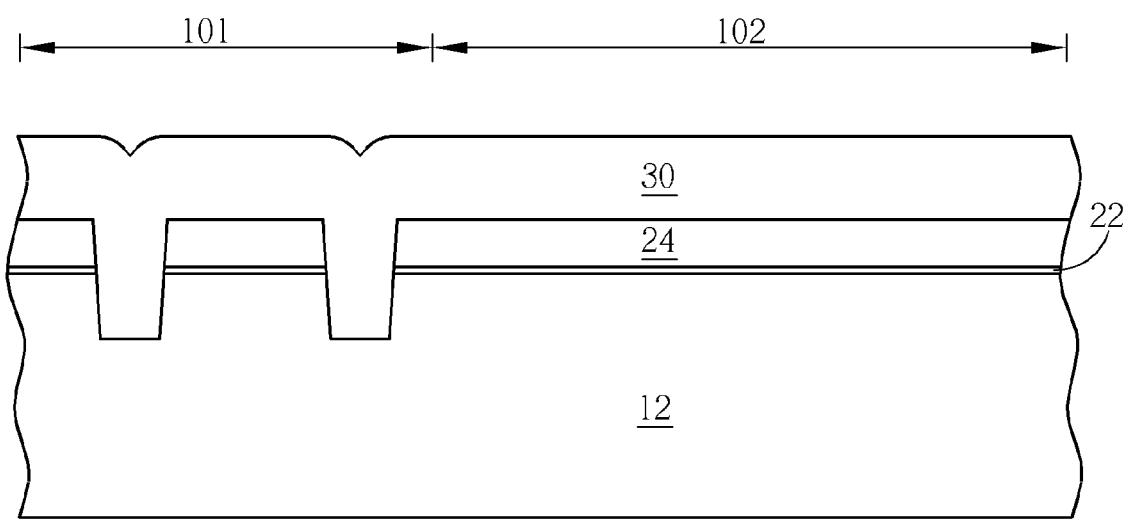
Figure 3:
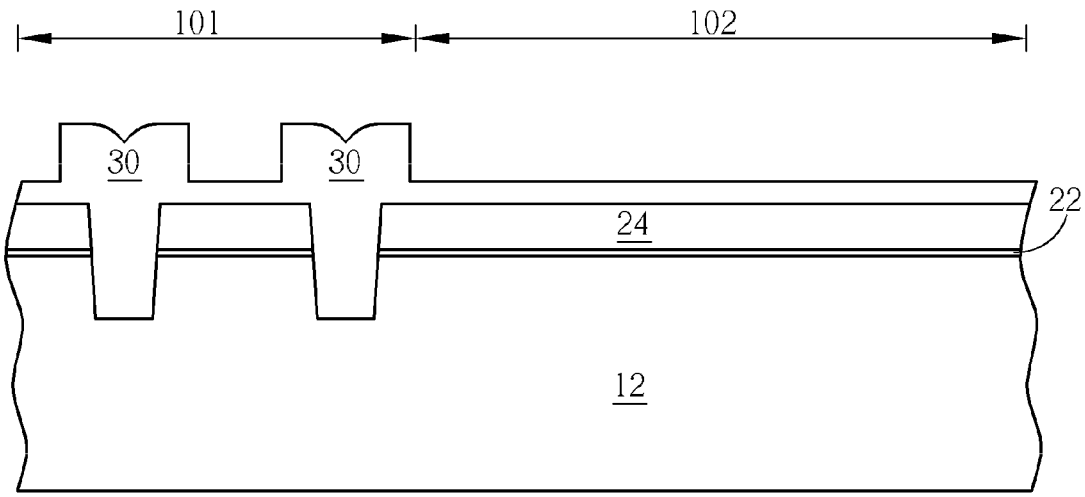
Figure 4:
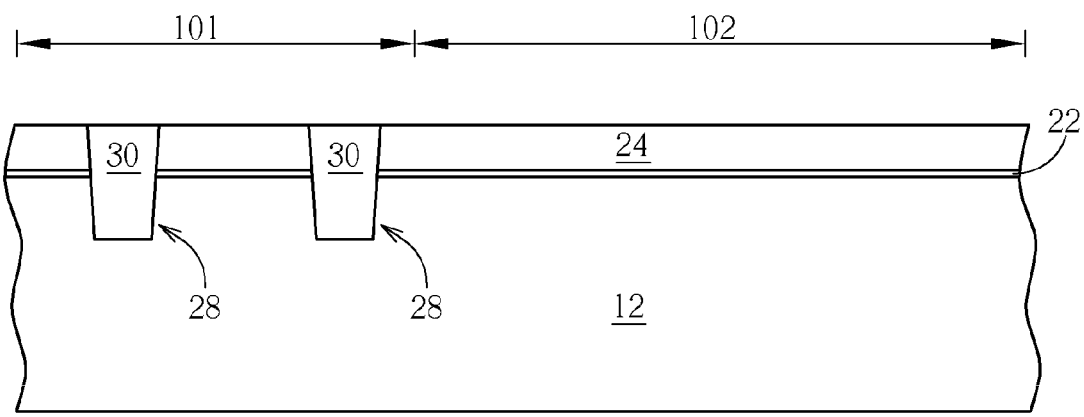
Figure 5:
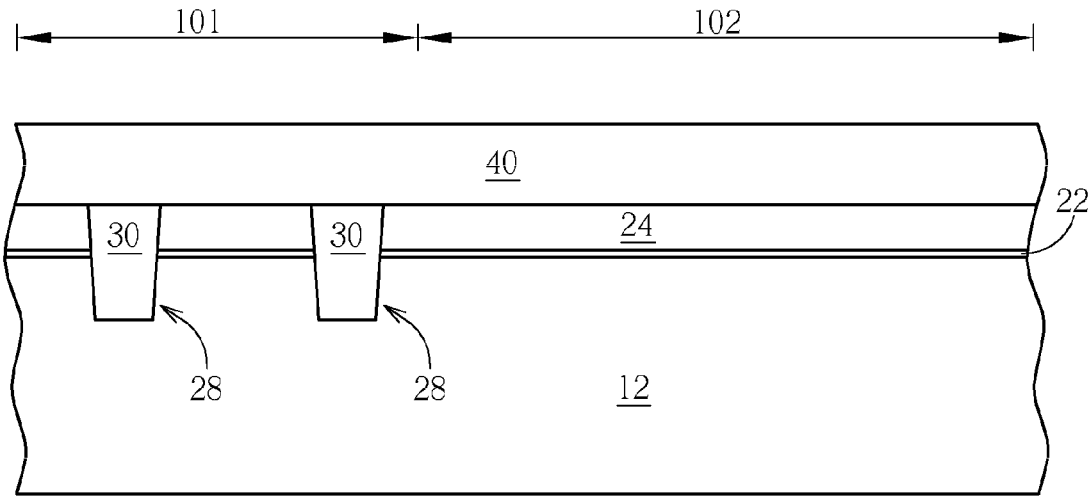
Figure 6:
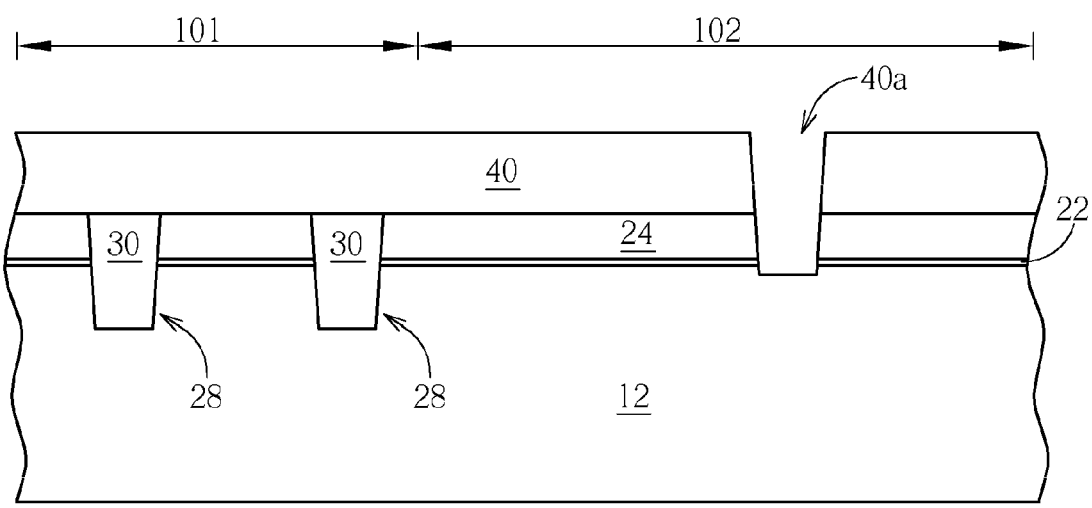
Figure 7:
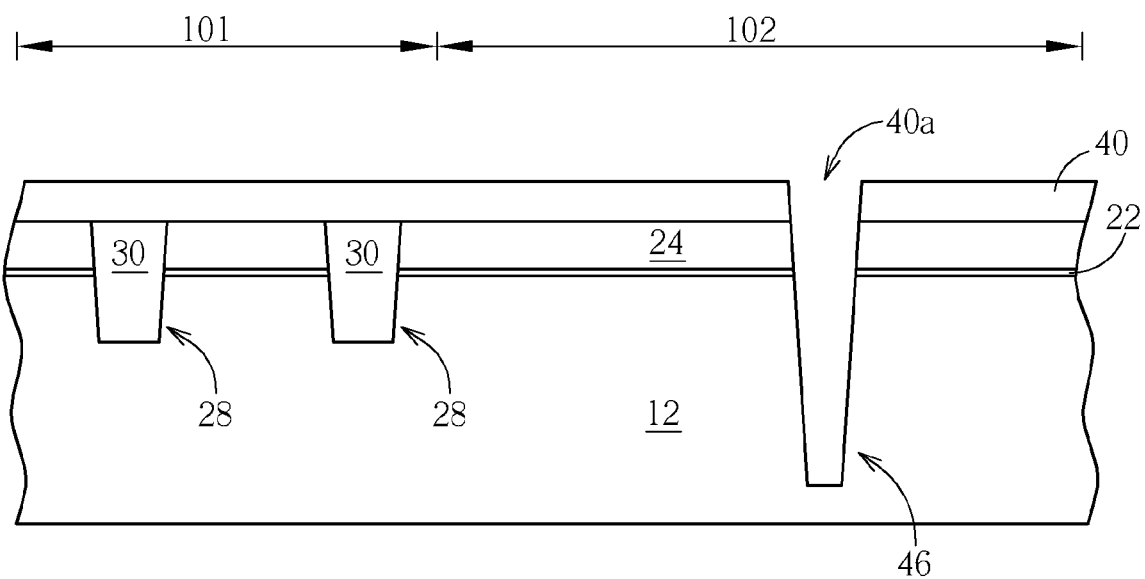
Figure 8:
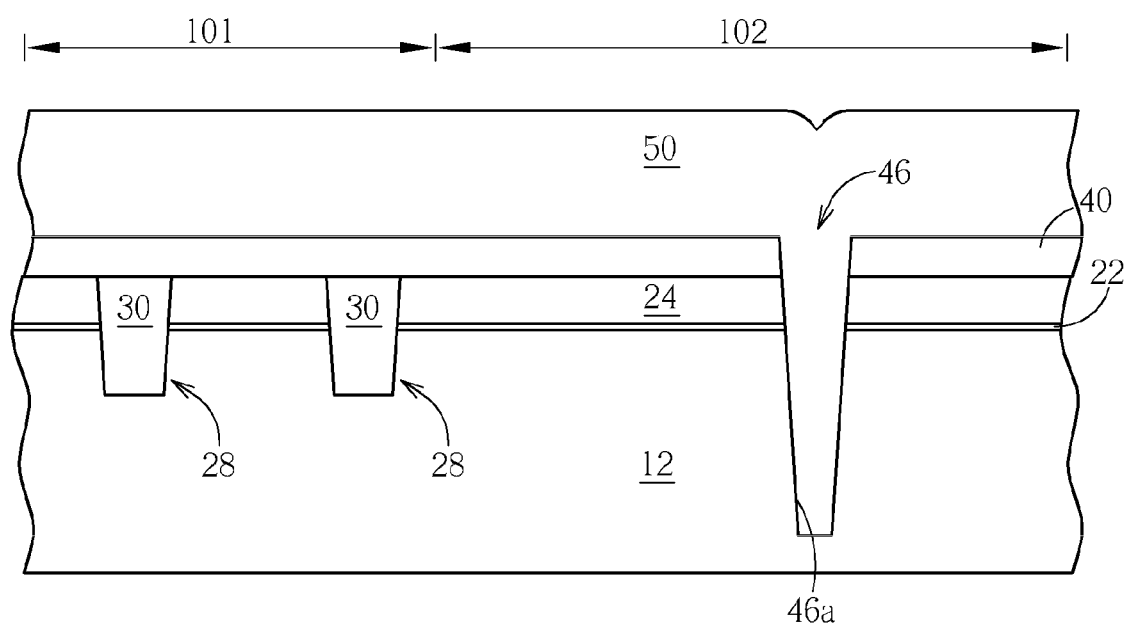
Figure 9:
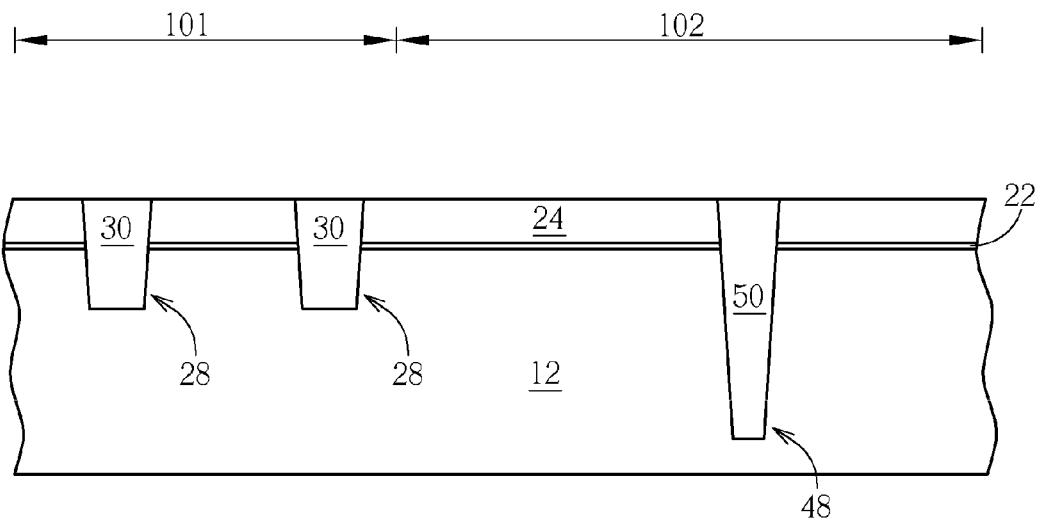
Figure 10:
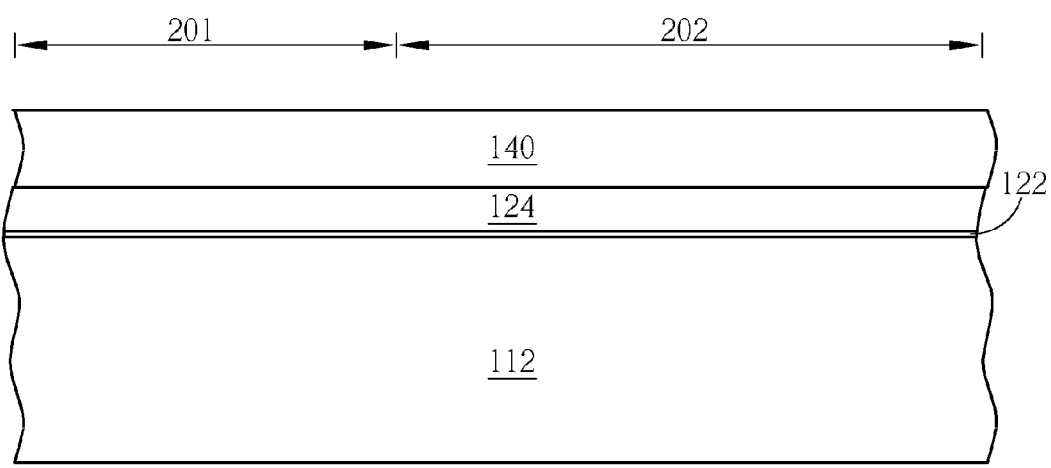
FIGS. 10-14 are schematic, cross-sectional diagrams showing an exemplary method for forming trenches and trench isolation on a substrate in accordance with one embodiment of this invention.

FIGS. 10-14 are schematic, cross-sectional diagrams showing an exemplary method for forming trenches and trench isolation on a substrate in accordance with one embodiment of this invention. As shown in FIG. 10, a substrate 112 is provided. For example, the substrate 112 may be semiconductor substrate or silicon substrate, but not limited thereto. In other embodiments, the substrate 112 may be an epitaxial layer grown on a silicon substrate. According to the embodiment of this invention, the surface of the substrate 112 may be divided into a first area 201 and a second area 202. For example, the first area 201 may be a logic circuit area of an image sensor device, and the second area 202 may be a pixel array area of the image sensor device. A pad oxide layer 122, a pad nitride layer 124 and a hard mask 140 are formed on the surface of the substrate 112. The hard mask 140 may be a silicon oxide layer formed by chemical vapor deposition methods.

Figure 11:
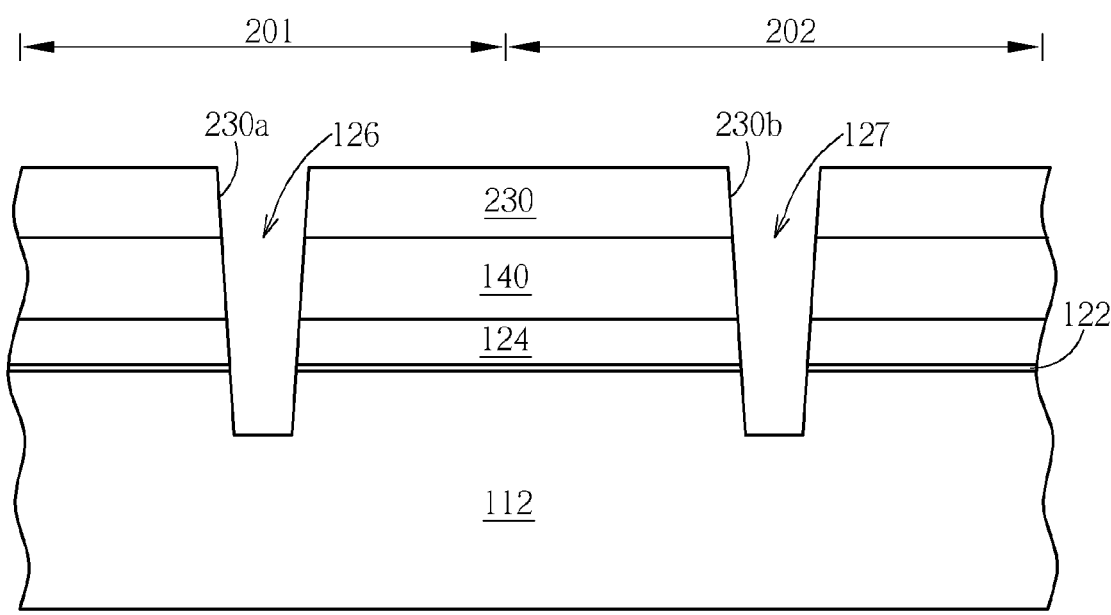

As shown in FIG. 11, a first patterned photoresist layer 230 is formed on the surface of the hard mask 140, wherein the first patterned photoresist layer 230 comprises at least a first opening 230a in the first area 201 and at least a second opening 230b in the second area 202. The first opening 230a defines the position and pattern of the shallow trench isolation to be formed in the substrate within the first area 201. The second opening 230b defines the position and pattern of the deep trench isolation to be formed in the substrate within the second area 202. Subsequently, a first etching process is performed to etch the hard mask 140, the pad nitride layer 124, the pad oxide layer 122 and the substrate 112 through the first and second openings 230a and 230b, thereby forming a first shallow trench 126 within the first area 201 and a second shallow trench 127 within the second area 202. The first patterned photoresist layer 230 is then stripped off.

Figure 12:
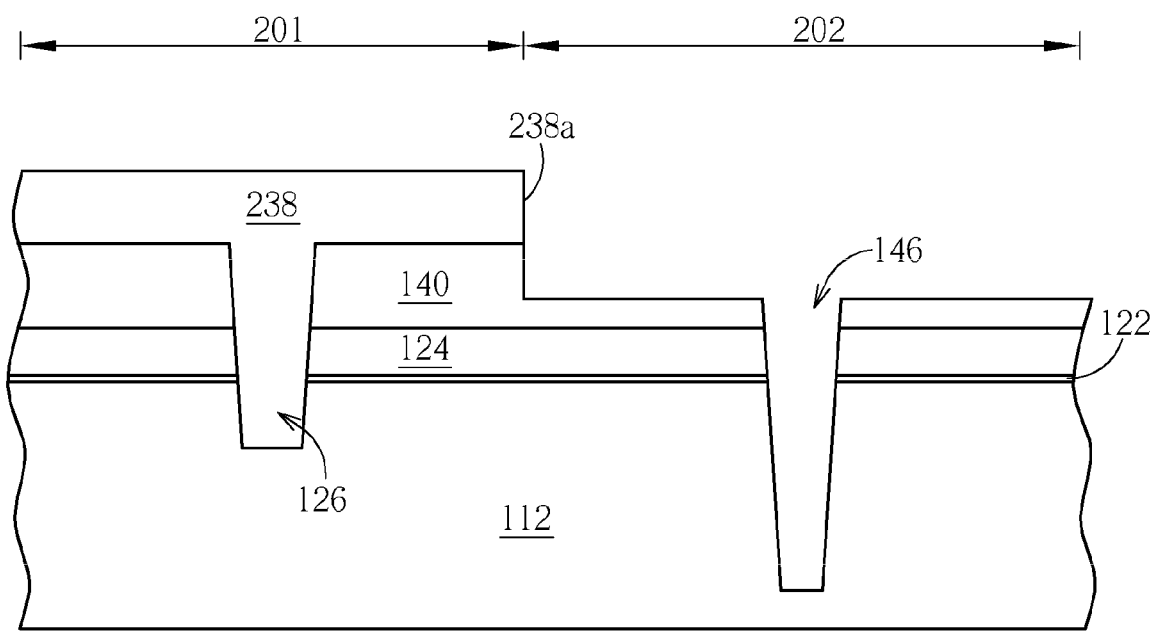

As shown in FIG. 12, a second patterned photoresist layer 238 is formed on the hard mask 140. The second patterned photoresist layer 238 covers the first area 201 and fills the first shallow trench 126 within the first area 201. The second patterned photoresist layer 238 comprises an opening 238a that exposes the second area 202. Subsequently, using the second patterned photoresist layer 238 and the hard mask 140 as an etching hard mask, a second etching process is performed to etch a bottom of the second shallow trench 127, thereby forming a deep trench 146. The second patterned photoresist layer 238 is then removed. After the removal of the second patterned photoresist layer 238, the formation of the shallow trench 126 within the first area 201 and the deep trench 146 within the second area 202 is completed.

Figure 13:
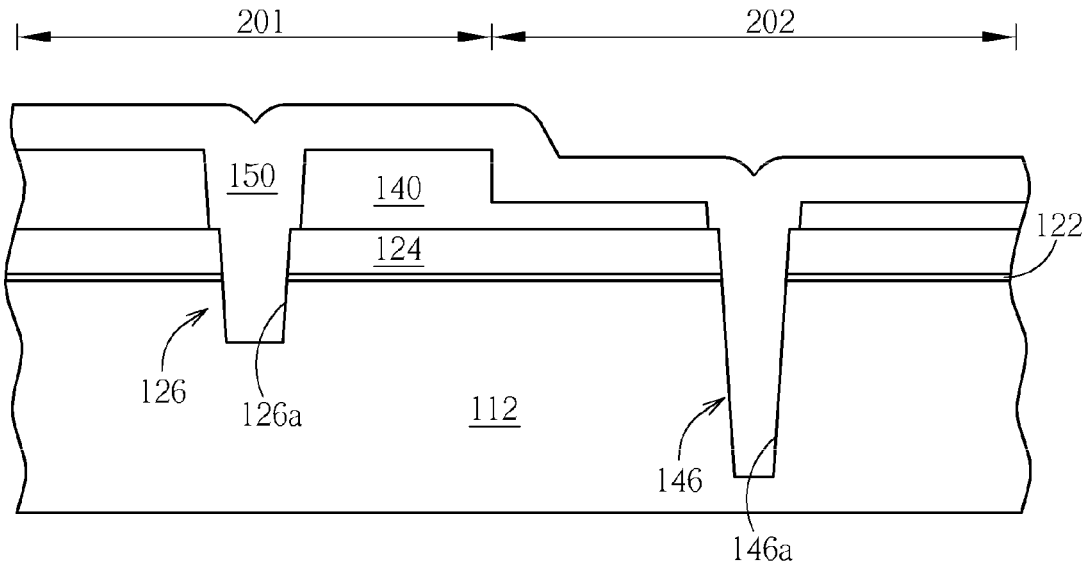

As shown in FIG. 13, an oxidation process is then carried out to concurrently form an oxide liner 126a on the surface of the shallow trench 126 and an oxide liner 146a on the surface of the deep trench 146. A chemical vapor deposition process is then carried out to deposit an oxide layer 150 over the substrate 112. The oxide layer 150 fills the shallow trench 126 and the deep trench 146. After the deposition of the oxide layer 150, a densification process is carried out to densify the oxide layer 150.

Figure 14:
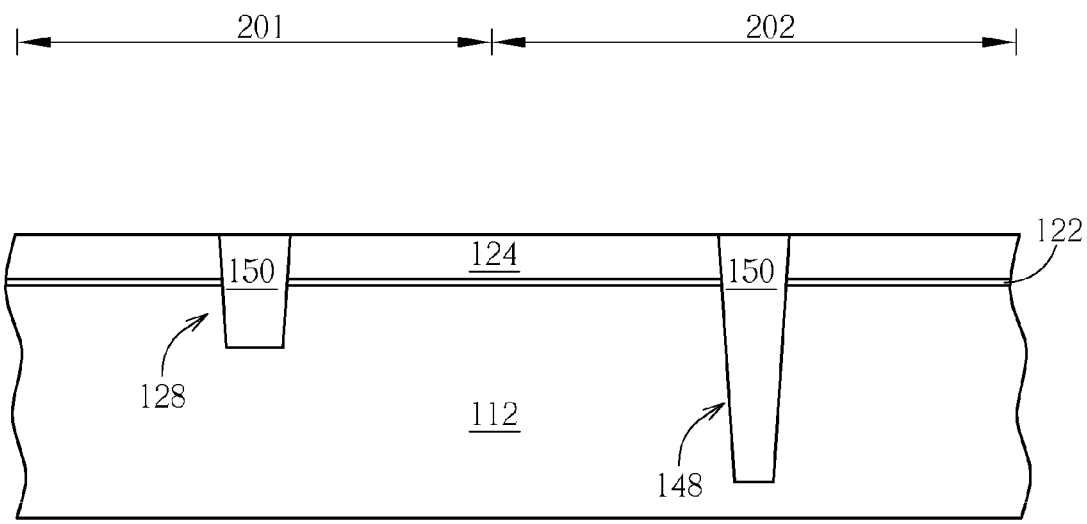

As shown in FIG. 14, after the densification process, a chemical mechanical polishing (CMP) process is performed to remove the oxide layer 150 on the pad nitride layer 124 and the remaining hard mask 140 outside the shallow trench 126 and the deep trench 146, to thereby form a flat surface. After the CMP process, the formation of the shallow trench isolation structure 128 within the first area 201 and the deep trench isolation structure 148 within the second area 202 is completed.

To sum up, the present invention provide an integrated, simplified method for forming shallow/deep trenches and STI/DTI on a main surface of the substrate. It is advantageous to use the present invention because the trench oxide liner in the first and second areas can be formed concurrently in one single step. Only one gap filling step, one densification process and one CMP process are required to form the STI structure 128 in the first area 201 and the DTI structure 148 in the second area 202. Further, the reverse mask that is typically used in the prior art method for exposing the oxide layer in the second area 102 can be spared according to this invention, and the etching process for etching the oxide layer 30 in the second area 202 can also be spared, which effectively reduce the manufacture cost and greatly improve cycle time.

Those skilled in the art will readily observe that numerous modifications and alterations of the device and method may be made while retaining the teachings of the invention.

What is claimed is:

1. A method for forming a trench, comprising:
providing a substrate having a hard mask and a pad nitride layer disposed under the hard mask, wherein the substrate has thereon a first shallow trench and a second shallow trench disposed thereon, and the hard mask comprises a silicon oxide layer;
forming a patterned filling layer, wherein the patterned filling layer fills the first shallow trench while exposing the second shallow trench; and
using the patterned filling layer as an etching hard mask to etch a bottom of the second shallow trench thereby forming a deep trench;
removing the patterned filling layer;
depositing an oxide layer to fill the first shallow trench and the deep trench; and
performing a chemical mechanical polishing (CMP) process to simultaneously remove the oxide layer and the hard mask outside the first shallow trench and the deep trench until the exposure of the pad nitride layer.

2. The method for forming a trench according to claim 1 wherein the patterned filling layer is a photoresist layer.

3. A method for forming a trench, comprising:
providing a substrate having a hard mask and a pad layer thereon, wherein the pad layer is disposed under the hard mask and the pad layer comprises a pad oxide layer and a pad nitride layer;
forming a first patterned photoresist layer on the substrate and performing an etching process by using the first patterned photoresist layer as a mask thereby forming a first shallow trench and a second shallow trench;
removing the first patterned photoresist layer;
after completely removing the first patterned photoresist layer, covering the substrate with a second patterned photoresist layer, wherein the second patterned photoresist layer masks the first shallow trench while exposing the second shallow trench;
using the second patterned photoresist layer as an etching hard mask to partially etch the hard mask exposed from the second patterned photoresist layer and to etch a bottom of the second shallow trench thereby forming a deep trench; and
performing a chemical mechanical polishing (CMP) process to remove the hard mask until the exposure of the pad layer.

4. The method for forming a trench according to claim 3 wherein the first shallow trench is situated in a first area and the second shallow trench is situated in a second area, and wherein the first area does not overlap with the second area.

5. The method for forming a trench according to claim 4 wherein the first area is a logic circuit area of an image sensor device.

6. The method for forming a trench according to claim 5 wherein the second area is a pixel array area of the image sensor device.

7. The method for forming a trench according to claim 3 wherein the second patterned photoresist layer is removed after the formation of the deep trench.

8. The method for forming a trench according to claim 3 wherein the second patterned photoresist layer fills the first shallow trench.

9. The method for forming a trench according to claim 3 wherein the substrate comprises a semiconductor substrate, a silicon substrate or an epitaxial substrate.

10. The method for forming a trench according to claim 3 wherein the hard mask comprises a silicon oxide layer.

11. The method for forming a trench according to claim 3 further comprising:

forming a first oxide liner and a second oxide liner on a surface of the first shallow trench and a surface of the deep trench; and depositing an oxide layer to fill the first shallow trench and the deep trench.

12. The method for forming a trench according to claim 3, wherein before performing the CMP process, the method further comprises depositing an oxide layer into the first shallow trench and the deep trench.

13. The method for forming a trench according to claim 12, wherein the oxide layer and the hard mask outside the first shallow trench and the deep trench are removed simultaneously during the CMP process.

14. The method for forming a trench according to claim 12 further comprising densifying the oxide layer.

* * * * *